United States Patent
Nishi et al.

(10) Patent No.: US 11,009,466 B2
(45) Date of Patent: May 18, 2021

(54) DISCHARGE DETECTION SYSTEM AND DISCHARGE DETECTION METHOD

(71) Applicants: SUBARU CORPORATION, Tokyo (JP); KYUSHU INSTITUTE OF TECHNOLOGY, Kitakyushu (JP)

(72) Inventors: Takayuki Nishi, Tokyo (JP); Shinya Ohtsuka, Kitakyushu (JP)

(73) Assignees: SUBARU CORPORATION, Tokyo (JP); KYUSHU INSTITUTE OF TECHNOLOGY, Kitakyushu (JP)

( * ) Notice: Subject to any disclaimer, the term of this patent is extended or adjusted under 35 U.S.C. 154(b) by 0 days.

(21) Appl. No.: 16/596,555

(22) Filed: Oct. 8, 2019

(65) Prior Publication Data

US 2020/0141872 A1 May 7, 2020

(30) Foreign Application Priority Data

Nov. 7, 2018 (JP) .............................. JP2018-210111

(51) Int. Cl.
 | | |
 |---|---|
 | *G01N 21/67* | (2006.01) |
 | *G01J 3/443* | (2006.01) |
 | *G01J 3/457* | (2006.01) |
 | *G01J 3/28* | (2006.01) |

(52) U.S. Cl.
CPC .............. *G01N 21/67* (2013.01); *G01J 3/443* (2013.01); *G01J 3/457* (2013.01); *G01J 2003/2859* (2013.01); *G01N 2201/08* (2013.01)

(58) Field of Classification Search
CPC ...................................................... G01N 21/67

USPC ......................................................... 356/313
See application file for complete search history.

(56) References Cited

U.S. PATENT DOCUMENTS

| | | | |
|---|---|---|---|
| 5,402,236 A | 3/1995 | Brown et al. | |
| 2007/0103686 A1* | 5/2007 | Tornkvist | G01J 3/36 356/417 |
| 2014/0361789 A1 | 12/2014 | Ohtsuka et al. | |

(Continued)

FOREIGN PATENT DOCUMENTS

| | | |
|---|---|---|
| JP | H01-184474 A | 7/1989 |
| JP | H06-292323 A | 10/1994 |

(Continued)

OTHER PUBLICATIONS

Extended European Search Report dated Apr. 1, 2020 for European Patent Application No. 19203543.4-1010.

*Primary Examiner* — Tarifur R Chowdhury
*Assistant Examiner* — Omar H Nixon
(74) *Attorney, Agent, or Firm* — McGinn IP Law Group, PLLC

(57) ABSTRACT

A discharge detection system includes a plurality of optical fibers having different optical distances from each other and provided to allow discharge light generated from a test object to enter at least one of the optical fibers, an optical sensor configured to detect the discharge light having entered the at least one of the optical fibers and to output a detection signal having a temporal change in an amplitude of the detection signal, the temporal change in the amplitude corresponding to a temporal change in intensity of the discharge light, and a signal processing system configured to identify an area where the discharge light is generated based a point of time of at least one peak in the detection signal.

20 Claims, 2 Drawing Sheets

(56) References Cited

U.S. PATENT DOCUMENTS

| | | | |
|---|---|---|---|
| 2016/0018459 A1* | 1/2016 | Ohtsuka | G01R 31/1218 |
| | | | 324/754.21 |
| 2016/0169958 A1 | 6/2016 | Ohtsuka et al. | |
| 2017/0059410 A1* | 3/2017 | Nishi | G01J 3/2803 |
| 2018/0356338 A1 | 12/2018 | Tanaka | |

FOREIGN PATENT DOCUMENTS

| | | |
|---|---|---|
| JP | 2013-152155 A | 8/2013 |
| JP | 2013-200213 A | 10/2013 |
| JP | 2017-049025 A | 3/2017 |
| WO | WO 2017/090516 A1 | 6/2017 |

* cited by examiner

DISCHARGE DETECTION SYSTEM AND DISCHARGE DETECTION METHOD

CROSS-REFERENCE TO RELATED APPLICATION

The present application claims priority to Japanese Patent Application No. 2018-210111 filed on Nov. 7, 2018, the entire content of which is incorporated herein by reference.

BACKGROUND

Exemplary embodiments of the present disclosure relates to a discharge detection system and a discharge detection method.

In order to prevent explosion from being caused by an electric discharge (hereinafter "discharge") occurring inside a fuel tank of an aircraft by static electricity or lightning, a test is performed to confirm a discharge or spark light (see, e.g., JP2017-049025A). A discharge confirmation test for an aircraft is typically performed by applying electric current to a test fuel tank not filled with fuel and by capturing images using a number of cameras and mirrors. When a discharge occurs due to the current flowing through the test fuel tank, images of the discharge light are captured by the cameras. An inspector can identify a location where the discharge occurred when the discharge light is found through visual observation of the captured images.

According to another related art, a light emitting location identification system has optical fibers arranged with their ends being disposed at different positions, and a location where discharge light is generated is detected by the discharge light entering the optical fibers (see, e.g., JP2013-200213A). Other related art relates to an apparatus for measuring of a location and/or a size of discharge for aircrafts and others (see, e.g., JPH01-184474A and JP2013-152155A).

With the discharge confirmation test using cameras, the required number of cameras and mirrors increases when a configuration of a test object becomes complex. If the number of cameras and mirrors is insufficient, a discharge may be overlooked. In addition, checking a discharge through a visual observation requires inspector's labor and skill.

Also with the system having the optical fibers, the required number of optical fibers increases when a configuration of a test object becomes complex, leading also to an increase in the number of optical sensors for detecting discharge light entering the optical fibers.

It is desirable to achieve an accurate and easy detection of a location of discharge.

SUMMARY

According to an illustrative aspect of the present disclosure, a discharge detection system includes a plurality of optical fibers having different optical distances from each other and provided to allow discharge light generated from a test object to enter at least one of the optical fibers, an optical sensor configured to detect the discharge light having entered the at least one of the optical fibers and to output a detection signal having a temporal change in an amplitude of the detection signal, the temporal change in the amplitude corresponding to a temporal change in intensity of the discharge light, and a signal processing system configured to identify an area where the discharge light is generated based on a point of time of at least one peak in the detection signal.

According to another illustrative aspect of the present disclosure, a discharge detection method uses the discharge detection system described above to identify the area where the discharge light is generated.

According to another illustrative aspect of the present disclosure, a discharge detection method includes causing discharge light generated from a test object to enter at least one of a plurality of optical fibers having different optical distances from each other, detecting the discharge light having entered the at least one of the plurality of optical fibers by an optical sensor to acquire a detection signal having a temporal change in an amplitude of the detection signal, the temporal change in the amplitude corresponding to a temporal change in intensity of the discharge light, and identifying an area where the discharge light is generated based on a point of time of at least one peak in the detection signal.

According to an illustrative aspect of the present disclosure, a discharge detection system includes a plurality of optical fibers having different optical distances from each other and provided to allow discharge light generated from a test object to enter at least one of the optical fibers, an optical sensor configured to detect the discharge light having entered the at least one of the optical fibers and to output a detection signal having a temporal change in an amplitude of the detection signal, the temporal change in the amplitude corresponding to a temporal change in intensity of the discharge light, and circuitry configured to identify an area where the discharge light is generated based on a point of time of at least one peak in the detection signal.

DETAILED DESCRIPTION

Figure 1:
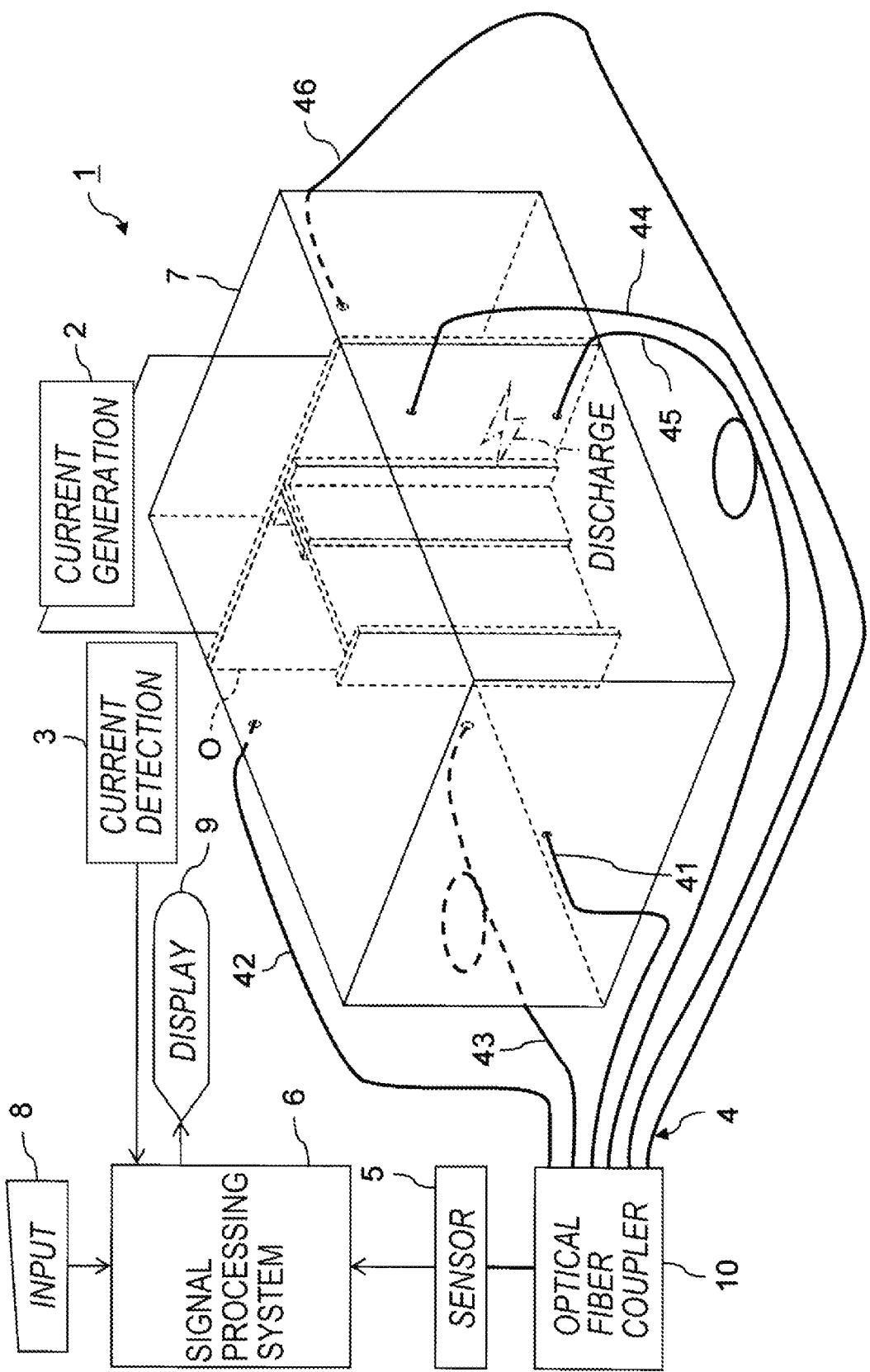
FIG. 1 is a configuration diagram of a discharge detection system according to an exemplary embodiment of the present disclosure.

Hereinafter, a discharge detection system 1 and a discharge detection method according to an exemplary embodiment of the present disclosure will be described with reference to the drawings. Note that sizes, materials, specific values, and any other factors illustrated in the embodiment are illustrative for easier understanding of the disclosure, and are not intended to limit the scope of the disclosure unless otherwise specifically stated. Further, elements in the following example embodiment which are not recited in a most-generic independent claim of the disclosure are optional and may be provided on an as-needed basis. Throughout the present specification and the drawings, elements having substantially the same function and configuration are denoted with the same reference numerals to avoid any redundant description. Further, elements that are not directly related to the disclosure are unillustrated in the drawings. The drawings are schematic and are not intended to be drawn to scale.

As shown in FIG. 1, the discharge detection system 1 is configured to apply electric current to a test object O and to identify an area or a location where discharge light is generated. The discharge detection system 1 includes a current generating circuit 2, a current detecting circuit 3, a plurality of optical fibers 4, one or more optical sensors 5, a signal processing system 6, a dark box 7, an input device 8, and a display 9.

The test object O is an inspection target with which an area or a location a discharge light generation is detected, and is placed inside the dark box 7. In the example of FIG. 1, the test object O is a simulated aircraft part with a typical structure having an I-shaped reinforcement member attached to a panel. The test object O may be made of, for example, a metal or a fiber reinforced plastic (FRP) such as a carbon fiber reinforced plastic (CFRP).

The current generating circuit 2 is configured to apply electric current to the test object O placed inside the dark box 7. When performing a discharge confirmation test on an aircraft part by the discharge detection system 1, the current generating circuit 2 can apply simulated lightning current to the test object O. When the current flows through the test object O, discharge may occur. The discharge detection system 1 is configured to detect discharge light so as to find out whether the discharge would occur when the current is applied to the test object O, and also an area or a location where the discharge would occur.

The current detecting circuit 3 is configured to detect a timing of applying the current to the test object O. When the current flows into the test object O, an electromagnetic wave is induced. Therefore, the current detecting circuit 3 may include a non-contact type current probe for detecting a value of the current flowing into the test object O or an antenna for detecting the electromagnetic wave. The start of application of the current to the test object O detected in the current detecting circuit 3 is notified to the signal processing system 6. as a signal indicative of the detection of the applied current The plurality of optical fibers 4 have different optical distances (optical path lengths) from each other. An optical distance is defined by multiplying a refractive index of media by a distance along which light actually propagates through the media. Accordingly, when the refractive indices of the optical fibers 4 are the same, the optical distances are determined by the lengths of the optical fibers 4 different from one another.

Ends of the optical fibers 4 are disposed at positions such that discharge light, which may be generated somewhere on the test object O placed inside the dark box 7, can enter at least one of the ends of the optical fibers 4. In the example of FIG. 1, six optical fibers 41, 42, 43, 44, 45 and 46 having different lengths L1, L2, L3, L4, L5 and L6 from one another are fixed with their ends being inserted into respective through holes provided in four side walls of the dark box 7. Therefore, even with the test object O having a complex structure that may create a shadow area, discharge light generated from the text object O can enter at least one of the ends of the optical fibers 41, 42, 43, 44, 45 and 46.

The other ends of the optical fibers 4 are connected to the optical sensor 5. Alternatively, the optical sensors 5 may be connected to the optical fibers 4 individually. However, a single optical sensor 5 may be designed to be connected to all or some of the optical fibers 4, in other words, at least two of the optical fibers 4. When ends of all or some of the optical fibers 4 are connected to this shared optical sensor 5, the ends of all or some of the optical fibers 4 can be connected to the shared optical sensor 5 through an optical fiber coupler 10.

Thus, discharge light which has entered all or some of the optical fibers 4 can be detected by the same optical sensor 5.

Therefore, it is possible to reduce the number of the optical sensors 5 to thereby simplify the configuration of the discharge detection system 1.

In the example shown in FIG. 1, the respective ends of the six optical fibers 41, 42, 43, 44, 45 and 46 are connected to the single optical sensor 5 through the optical fiber coupler 10. Incidentally, a fused fiber coupler manufactured by heating and melting a plurality of optical fibers and then fusing and stretching the optical fibers is representative of the optical fiber coupler 10.

The optical sensor 5 is a photodetector which detects the discharge light having entered at least one of the optical fibers 4 and outputs a detection signal to the signal processing system 6. The detection signal has a temporal change in an amplitude of the detection signal, the temporal change in the amplitude corresponding to a temporal change in intensity of the discharge light. The optical sensor 5 can be constituted by a photoelectric transducer such as a photomultiplier tube (PMT) or a photodiode. The detection signal of the discharge light is output as an electric signal from the optical sensor 5 constituted by the photoelectric transducer to the signal processing system 6.

The signal processing system 6 is configured to detect an area or a location where the discharge light is generated by processing the discharge light detection signal input from the optical sensor 5. The optical sensor 5 outputs the discharge light detection signal as analog signal. The signal processing system 6 may include an electric circuit with an analog-to-digital converter (A/D converter), a computer, and the like.

Figure 2:
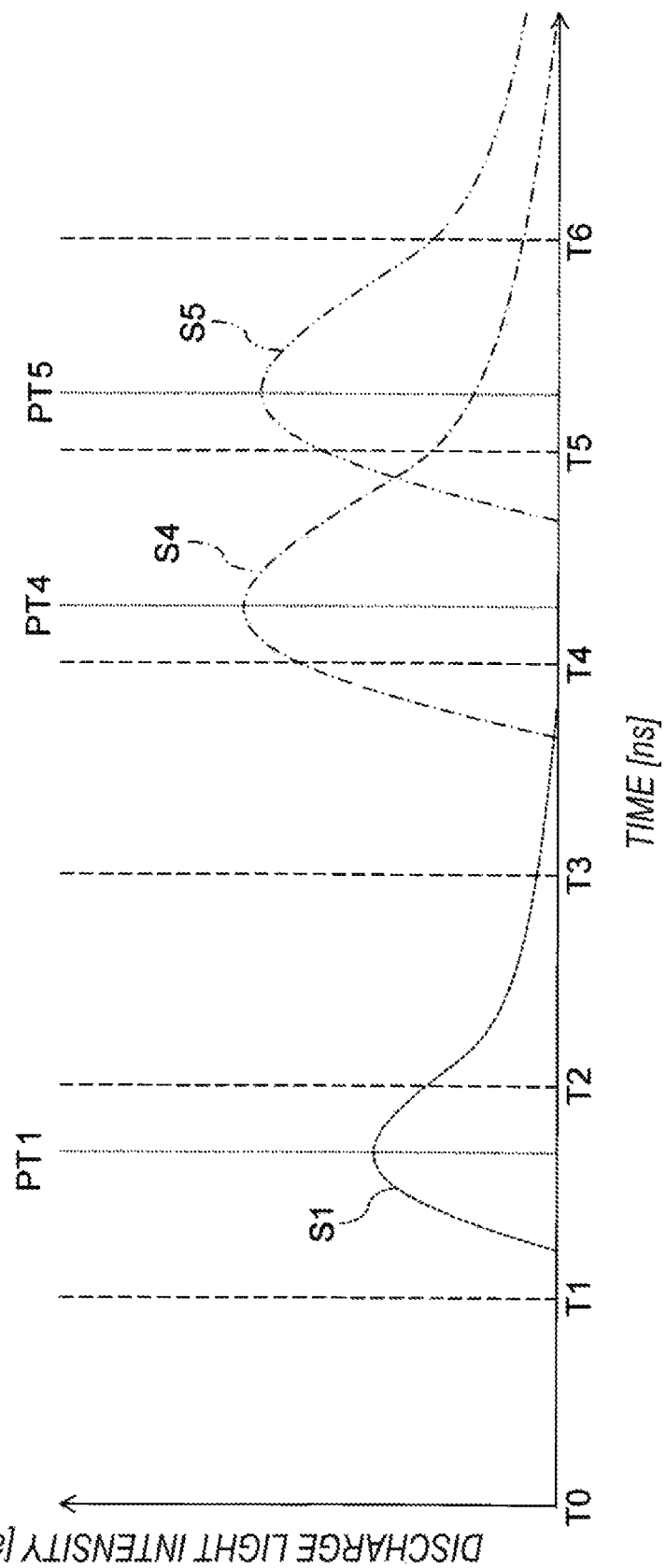
FIG. 2 is a graph showing an example of a discharge light detection signal sent from an optical sensor to a signal processing system illustrated in FIG. 1.

FIG. 2 is a graph showing an example of a discharge light detection signal sent from the optical sensor 5 to the signal processing system 6.

In FIG. 2, the abscissa designates time (ns), and the ordinate designates relative intensity (arbitrary unit) of discharge light. Waveforms of the detection signal of the discharge light output from the optical sensor 5 to the signal processing system 6 are, for example, waveforms shown in FIG. 2.

Specifically, the optical fibers 4 have different optical lengths from one another. Time taken for one optical fiber 4 to propagate the discharge light from one end on the light entering side to the other end on a side of the optical sensor 5 differs from the corresponding time taken for another optical fiber 4. Accordingly, when the discharge light enters more than one optical fibers 4, discharge light with different peak timings its intensity is detected by the optical sensor 5. In this case, a detection signal representing a temporal change in intensity of discharge light exhibiting a plurality of peaks at different points of time is acquired by the signal processing system 6, and the number of the peaks corresponds to the number of the optical fibers 4 the discharge light has entered.

With the start of application of the current detected by the current detecting circuit 3 being a reference, and with the start of application of the current to the test object O being defined as an initial point of time T0, the signal processing system 6 automatically detects respective points of time at which the peaks in the discharge light detection signal are observed. The respective points of time of the peaks are obtained by adding, to the initial point of time T0, a time from the start of application of the current to the generation of the discharge light, a time required for the generated discharge light to travel through the air and reach the end of the corresponding optical fiber 4, and a time required for the discharge light to propagate through the corresponding optical fiber 4 from one end to the other end.

A location where the discharge light is to be generated on a surface of the test object O is uncertain. Accordingly, the time from the start of application of the current to the generation of the discharge light and also the time required for the generated discharge light to travel through the air and reach at least one of the ends of the optical fibers 4 are uncertain. On the other hand, the time required for the discharge light to propagate through each optical fiber 4 from one end to the other end is determined uniquely based on the optical distance of the corresponding optical fiber 4.

Therefore, differences among the optical distances of the optical fibers 4 can be determined such that peaks in the discharge light detection signal are not observed at the same timing regardless of a location where the discharge light entering one or more of the optical fibers 4 is generated on a surface of the test object O. The signal processing system 6 can then automatically detect peaks in the discharge light detection signal and identify one or more of the optical fibers 4 into which the discharge light has entered, based on timings of the peaks in the discharge light detection signal and the optical distances of the optical fibers 4.

Therefore, even when discharge light having entered the plurality of optical fibers 4 are detected by the shared optical sensor 5, one or more of the optical fibers 4 through which the discharge light have propagated can be identified in the signal processing system 6. In other words, as long as the optical distances of the optical fibers 4 are made sufficiently different from each other, detection signals of the discharge light having entered the optical fibers 4 can be multiplexed.

As a specific example, lengths L1, L2, L3, L4, L5 and L6 of the six optical fibers 41, 42, 43, 44, 45, and 46 can be determined such that, regardless of a location on the test object O where discharge light entering one or more the optical fibers 4 is generated, a point of time PT1 of peak in intensity of discharge light propagating through the optical fiber 41 with the length L1 is between time T1 (>T0) and time T2 (>T1), a point of time PT (L2) of peak in intensity of discharge light propagating through the optical fiber 42 with the length L2 is between time T2 and time T3 (>T2), a point of time PT (L3) of peak in intensity of discharge light propagating through the optical fiber 43 with the length L3 is between time T3 and time T4 (>T3), a point of time PT4 of peak in intensity of discharge light propagating through the optical fiber 44 with the length L4 is between the time T4 and time T5 (>T4), a point of time PT5 of peak in intensity of discharge light propagating through the optical fiber 45 with the length L5 is between the time T5 and time T6 (>T5), and a point of time PT (L6) of peak in intensity of discharge light propagating through the optical fiber 46 with the length L6 is after time T6.

Thus, as illustrated in FIG. 2, it is possible to automatically determine that discharge light have entered and propagated through the optical fiber 41 with the length L1, the optical fiber 44 with the length L4, and the optical fiber 45 with the length L5 when discharge light detection signal including a signal waveform S1 of the discharge light, a signal waveform S4 of the discharge light, and a signal waveform S5 of the discharge light is acquired in the signal processing system 6. The signal waveform S1 exhibits a peak at the point of time PT1 at which the peak may appear when the discharge light has propagated through the optical fiber 41 with the length L1. The signal waveform S4 exhibits a peak at the point of time PT4 at which the peak may appear when the discharge light has propagated through the optical fiber 44 with the length L4. The signal waveform S5 exhibiting a peak at the point of time PT5 at which the peak may appear when the discharge light has propagated through the optical fiber 45 with the length L5.

When the optical fibers 4 the discharge light has entered can be identified in the signal processing system 6, an area where the discharge light is generated can be also automatically identified in the signal processing system 6 based on the positions of the ends of the optical fibers 4 the discharge light has entered. That is, it is possible to automatically determine that the discharge light is generated in the area where the discharge light may enter the ends of the optical fibers 4 determined as the optical fibers the discharge light has entered.

As a specific example, when the ends of the optical fiber 41 with the length L1, the optical fiber 44 with the length L4 and the optical fiber 45 with the length L5, which are determined as the optical fibers the discharge light has entered, as illustrated in FIG. 1, are disposed toward a specific area of the test object O, the signal processing system 6 can automatically determine that the specific area is the area where the discharge light is generated.

When the optical distances and the positions of the ends of the plurality of optical fibers 4 are thus determined, at least the area where the discharge light is generated can be automatically identified in the signal processing system 6 based on one or more points of time of peaks in detection signal of the discharge light which has entered and propagated through one or more of the optical fibers 4. Particularly, the optical sensor 5 such as the PMT is high in time resolution and can even detect discharge light whose light emission time is in the order of nanoseconds. Therefore, making the optical distances of the optical fibers 4 different from one another, differences among the points of time of peaks in the discharge light detection signal can be detected accurately in the signal processing system 6.

A difference in optical distance between two of the optical fibers 4 having the smallest difference between their optical distances is set to be greater than a difference between the maximum length of an optical distance between the end of one of the optical fiber 4 whose optical distance is shorter and a location on the surface of the test object O where the discharge light may be generated, and the minimum length of the optical distance between the end of the other optical fiber 4 whose optical distance is longer and the location on the surface of the test object O where the discharge light may be generated. Thus, the points of time of peaks in the intensity of the discharge light that has propagated through the different optical fibers 4 and detected by the optical sensor 5 can be different from one another. However, when the optical distances of the optical fibers 4 are changed at fixed intervals as illustrated in FIG. 2, determination of the lengths of the respective optical fibers 4 and signal processing on the detection signal of the discharge light in the signal processing system 6 can be simplified.

As the size of the test object O increases, an optical distance between each of the ends of the optical fibers 4 and the location on the surface of the test object O, where the discharge light may be generated, increases. Accordingly, in order to prevent time ranges, in which the respective peaks in the intensity of the discharge light can appear, from overlapping one another among the optical fibers 4, it is necessary to increase the differences in optical distance among the optical fibers 4 as the size of the test object O increases.

On the other hand, even when the points of time of peaks in the intensity of the discharge light that has propagated through the different optical fibers 4 are theoretically different from one another, there is a possibility that the points of time of peaks in the intensity of the discharge light cannot be detected as different points of time if the signal waveforms indicating the intensity of the discharge light overlap each other greatly. In order to separately detect the points of time of peaks in the intensity of the discharge light which have propagated through the different optical fibers 4, it is desirable that periods between leading edges and trailing edges of the signal waveforms representing the intensity of the discharge light which have propagated through the different optical fibers 4 are arranged not to overlap one another if possible.

The periods between the leading edges and the trailing edges of the signal waveforms representing the intensity of the discharge light correspond to a discharge period. The discharge is roughly classified into voltage spark and thermal spark. The voltage spark is discharge occurring in a short period in the order of nanoseconds at a timing at which current flows due to an applied voltage as soon as the voltage is applied to the test object O, On the other hand, the thermal spark is plasma occurring with a delay of about 10 µs after the current flows due to Joule heat caused by the current flowing into the test object O. The period of the thermal spark is about 100 µs, which is significantly longer than the voltage spark.

A typical signal waveform representing intensity of discharge light caused by the voltage spark is a sharp waveform. Therefore, by theoretical calculation based on a period in which the voltage spark continues, each of the differences in optical distance among the optical fibers 4 may be set to be equal to or longer than 1 meter if a difference in distance between each of the ends of the optical fibers 4 and a location of the spark is not taken into consideration, in order to prevent the signal waveforms representing the intensity of the discharge light caused by the voltage spark from overlapping among the different optical fibers 4. Accordingly, when each of the differences in the optical distance among the plurality of optical fibers 4 is set to be equal to or longer than 1 meter, the area where the discharge light is generated due to the voltage spark can be identified in the signal processing system 6 with excellent sensitivity.

Actually as a result that each of the differences in the optical distance among the optical fibers 4 was set as 5 meters and discharge light caused by voltage spark generated between metal electrodes was made to enter each of four optical fibers 4 and detected, it was confirmed that signal waveforms of the discharge light through the optical fibers 4 could be detected without overlapping one another among the optical fibers 4.

On the other hand, each of signal waveforms of discharge light caused by the thermal spark spreads out in a time direction. Therefore, when conditions for making it possible to distinguish the points of time of peaks from one another even if the signal waveforms representing intensity of the discharge light caused by the thermal spark overlap one another among the different optical fibers 4 are theoretically calculated based on a period in which the thermal spark continues, differences in optical distance among the optical fibers 4 may be set to be equal to or longer than 50 meters in the case where a difference in distance between each of the ends of the optical fibers 4 and a location of the spark is not taken into consideration. Accordingly, when the differences in optical distance among the plurality of optical fibers 4 are set to be equal to or longer than 50 meters, an area where the discharge light is generated due to the thermal spark can be identified in the signal processing system 6 with excellent sensitivity.

Each of the signal waveforms of the discharge light generated due to the thermal spark is not sharp and a peak may not appear conspicuously by some noise removal processing or on some detection conditions. Accordingly, it may be considered that the differences in optical distance among the plurality of optical fibers 4 are desirably set to be equal to or longer than 70 meters in order to obtain sufficient sensitivity. Actually as a result that each of the differences in the optical distance among the optical fibers 4 was set as 70 meters and discharge light caused by thermal spark generated from the test object O having a complex structure was made to enter two optical fibers 4, it was confirmed that two peaks are detected at different points of time.

The point of time of the peak in the discharge light detection signal also depends on the optical distance between the end of the optical fiber 4 the discharge light has entered and the location where the discharge light is generated. Accordingly, when the point of time of the peak in the discharge light detection signal is automatically detected in the signal processing system 6, the optical distance between the end of the optical fiber 4 the discharge light has entered and the location where the discharge light is generated can be calculated based on the point of time of the peak in the discharge light detection signal and the optical distance of the optical fiber 4 the discharge light has entered.

That is, the point of time obtained by subtracting a time required for the discharge light to propagate through the optical fiber 4 from the point of time of peak in the discharge light detection signal can be regarded as the point of time at which the discharge light has reached the end of the optical fiber 4. Therefore, an optical distance between the end of the optical fiber 4 and the location where the discharge light is generated can be calculated from light speed in the air. When the optical distance between the end of the optical fiber 4 and the location where the discharge light is generated can be calculated, the area where the discharge light is generated can be restricted because the location where the discharge light is generated is on the surface of the test object O. Specifically, the area defined by a set of points on the surface of the test object O having a certain distance from the end of the optical fiber 4, i.e. an intersection line between a surface of a hypothetical sphere having a radius of a certain length and the surface of the test object O can be, automatically identified as the area where the discharge light is generated.

Accordingly, when discharge light has entered three or more optical fibers 4, an optical distance between each end of the three or more optical fibers 4 the discharge light has entered and a location where the discharge light is generated can be calculated based on points of time of each peak in a detection signal of the discharge light that has entered the three or more optical fibers 4 and each of the optical distances of the three or more optical fibers 4 the discharge light has entered. In this case, the location where the discharge light is generated can be geometrically identified based on each of the optical distances between the each end of the three or more optical fibers 4 the discharge light has entered and the location where the discharge light is generated. That is, in the signal processing system 6, the location where the discharge light is generated can be automatically detected geometrically as an intersection point of the three or more spherical surfaces respectively centered on the ends of the three or more optical fibers 4 the discharge light has entered.

Information acquired in the signal processing system 6 can be displayed on the display 9 if occasions demand. In addition, necessary information can be input from the input device 8 to the signal processing system 6. As a specific example, when spatial position information of the surface of the test object O is used for information processing in the signal processing system 6, three-dimensional coordinate data of a solid model etc. representing the shape of the surface of the test object O can be input to the signal processing system 6.

In the discharge detection system 1 and the discharge detection method described above, the plurality of optical fibers 4 different in optical distance from one another have one ends disposed at different positions so that an area where discharge light is generated can be identified, based on light differences in time required for the discharge light to propagate through the respective optical fibers 4 different in optical distance from one another.

Therefore, according to the discharge detection system 1 and the discharge detection method, work for placing a large number of cameras or mirrors in order to prevent any dead angle from being generated is unnecessary, and observation of images by an inspector or an operation and an apparatus for simultaneously cutting shutters of the plurality of cameras can be also dispensed with. Particularly, placement of the optical fibers 4 is easier than placement of the cameras or mirrors. In addition, the optical sensor 5 can be shared by the plurality of optical fibers 4.

As a result, the time and cost required for the discharge confirmation test can be reduced. In addition, the positions and the directions of the ends of the optical fibers 4 can be adjusted easily. Accordingly, even with the test object O having a complex structure, generation of such a dead angle can be reduced. That is, the discharge confirmation test can be performed accurately and simply.

While the present disclosure has been described with reference to a certain exemplary embodiment thereof, the scope of the present disclosure is not limited to the exemplary embodiment described above, and it will be understood by those skilled in the art that various changes and modifications may be made therein without departing from the scope of the present disclosure as defined by the appended claims.

What is claimed is:

1. A discharge detection system comprising:
   a dark box configured to place a test target therein;
   a plurality of optical fibers having different optical distances from each other and provided to allow discharge light generated from the test object to enter at least one of the optical fibers, one ends of the plurality of optical fibers being respectively arranged on the dark box;
   an optical sensor configured to detect the discharge light having entered the at least one of the optical fibers and to output a detection signal having a temporal change in an amplitude of the detection signal, the temporal change in the amplitude corresponding to a temporal change in intensity of the discharge light, the other ends of the plurality of optical fibers being connected to the optical sensor; and
   a signal processing system configured to identify an area or location where the discharge light is generated based on a point of time of at least one peak in the detection signal.

2. The discharge detection system according to claim 1, wherein the signal processing system is configured to further identify, based on the point of time of the at least one peak in the detection signal and each of the optical distances of the plurality of optical fibers, the at least one of the optical fibers the discharge light has entered, and to identify the area where the discharge light is generated based on a position of an end of the at least one of the optical fibers the discharge light has entered.

3. The discharge detection system according to claim 1, wherein the signal processing system is configured to calculate, based on the point of time of the at least one peak in the detection signal and the optical distance of the at least one of the optical fibers the discharge light has entered, an optical distance from a position of an end of the at least one of the optical fibers the discharge light has entered to a location where the discharge light is generated, and to identify the area where the discharge light is generated based on the calculated optical distance.

4. The discharge detection system according to claim 1, wherein the signal processing system is configured to calculate, when the discharge light has entered three or more of the optical fibers, and based on the point of time of each peak in the detection signal of the discharge light having entered the three or more of the optical fibers and each of the optical distances of the three or more of the optical fibers, an optical distance from a position of an end of each of the three or more of the optical fibers to a location where the discharge light is generated, and identifies the location where the discharge light is generated based on the calculated optical distance.

5. The discharge detection system according to claim 1, wherein at least two of the plurality of optical fibers are connected to the same optical sensor through an optical fiber coupler to detect the discharge light having entered the at least two of the plurality of optical fibers.

6. The discharge detection system according to claim 1, further comprising a current generating circuit configured to apply electric current to the test object,
   wherein the signal processing system is configured to detect the point of time of the at least one peak in the detection signal with reference to a timing of applying the electric current.

7. The discharge detection system according to claim 1, wherein differences among the optical distances of the plurality of optical fibers are defined such that, regardless of a location on a surface of the test object where the discharge light having entered the at least one of the plurality of optical fibers is generated, the point of time of each peak in the detection signal of the discharge light is different from one another.

8. The discharge detection system according to claim 1, wherein a difference in optical distance between two of the optical fibers having a smallest difference between the optical distances of the two of the optical fibers is greater than a difference between a maximum length of an optical distance from an end of one of the two of the optical fibers whose optical distance is shorter of the two of the optical fibers to a location on a surface of the test object where the discharge light can be generated and a minimum length of an optical distance between an end of the other of the two of the optical fiber whose optical distance is longer of the two of the optical fibers and a location on the surface of the test object where the discharge light can be generated.

9. The discharge detection system according to claim 1, wherein a difference in optical distance among the plurality of optical fibers is equal to or longer than 1 meter, and
   wherein the signal processing system is configured to identify the area where the discharge light is caused by a voltage spark.

10. The discharge detection system according to claim 1, wherein a difference in optical distance among the plurality of optical fibers is equal to or longer than 50 meters, and wherein the signal processing system is configured to identify the area where the discharge light is caused by a thermal spark.

11. The discharge detection system according to claim 1, wherein the differences in optical distance among the optical fibers is increased as a size of the test object increases.

12. The discharge detection system according to claim 1, wherein the optical sensors are configured to be shared with the optical fibers.

13. A discharge detection method comprising:
respectively arranging one ends of plurality of optical fibers on a dark box, and connecting the other ends of the plurality of optical fibers to an optical sensor;
causing discharge light generated from a test object in the dark box to enter at least one of the plurality of optical fibers having different optical distances from each other;
detecting the discharge light having entered the at least one of the plurality of optical fibers by the optical sensor to acquire a detection signal having a temporal change in an amplitude of the detection signal, the temporal change in the amplitude corresponding to a temporal change in intensity of the discharge light; and
identifying an area or location where the discharge light is generated based on a point of time of at least one peak in the detection signal.

14. The discharge detection method according to claim 13, wherein the identifying further comprises of further identifying, based on the point of time of the at least one peak in the detection signal and each of the optical distances of the plurality of optical fibers, the at least one of the optical fibers the discharge light has entered, and to identify the area where the discharge light is generated based on a position of an end of the at least one of the optical fibers the discharge light has entered.

15. The discharge detection method according to claim 13, further comprises calculating, based on the point of time of the at least one peak in the detection signal and the optical distance of the at least one of the optical fibers the discharge light has entered, an optical distance from a position of an end of the at least one of the optical fibers the discharge light has entered to a location where the discharge light is generated, and to identify the area where the discharge light is generated based on the calculated optical distance.

16. The discharge detection method according to claim 13, further comprising calculating, when the discharge light has entered three or more of the optical fibers, and based on the point of time of each peak in the detection signal of the discharge light having entered the three or more of the optical fibers and each of the optical distances of the three or more of the optical fibers, an optical distance from a position of an end of each of the three or more of the optical fibers to a location where the discharge light is generated, and identifies the location where the discharge light is generated based on the calculated optical distance.

17. The discharge detection method according to claim 13, wherein differences among the optical distances of the plurality of optical fibers are defined such that, regardless of a location on a surface of the test object where the discharge light having entered the at least one of the plurality of optical fibers is generated, the point of time of each peak in the detection signal of the discharge light is different from one another.

18. A discharge detection system comprising:
a dark box configured to place a test object therein;
a plurality of optical fibers having different optical distances from each other and provided to allow discharge light generated from the test object to enter at least one of the optical fibers, one ends of the plurality of optical fibers being respectively arranged on the dark box;
an optical sensor configured to detect the discharge light having entered the at least one of the optical fibers and to output a detection signal having a temporal change in an amplitude of the detection signal, the temporal change in the amplitude corresponding to a temporal change in intensity of the discharge light, the other ends of the plurality of optical fibers being connected to the optical sensor; and
circuitry configured to identify an area or location where the discharge light is generated based on a point of time of at least one peak in the detection signal.

19. The discharge detection system according to claim 18, wherein the circuitry is configured to further identify, based on the point of time of the at least one peak in the detection signal and each of the optical distances of the plurality of optical fibers, the at least one of the optical fibers the discharge light has entered, and to identify the area where the discharge light is generated based on a position of an end of the at least one of the optical fibers the discharge light has entered.

20. The discharge detection system according to claim 18, wherein the circuitry is configured to calculate, based on the point of time of the at least one peak in the detection signal and the optical distance of the at least one of the optical fibers the discharge light has entered, an optical distance from a position of an end of the at least one of the optical fibers the discharge light has entered to a location where the discharge light is generated, and to identify the area where the discharge light is generated based on the calculated optical distance.

* * * * *